United States Patent [19]
Shih

[11] Patent Number: 5,166,635
[45] Date of Patent: Nov. 24, 1992

[54] DIGITAL DATA LINE DRIVER

[75] Inventor: Cheng C. Shih, Rancho Cordova, Calif.

[73] Assignee: Level One Communications, Inc., Folsom, Calif.

[21] Appl. No.: 675,648

[22] Filed: Mar. 27, 1991

[51] Int. Cl.⁵ ............................................... H03F 3/45
[52] U.S. Cl. ..................................... 330/253; 330/255; 330/258; 330/260; 330/295; 330/84; 330/311
[58] Field of Search ................. 330/84, 253, 255, 258, 330/260, 295, 311

[56] References Cited

U.S. PATENT DOCUMENTS 4,794,349 12/1988 Senderowicz et al. .............. 330/253
5,015,966  5/1991 McIntyre ........................ 330/258 X

OTHER PUBLICATIONS

Fisher et al., "A Highly Linear CMOS Buffer Amplifier", *IEEE Journal of Solid-State Circuits*, vol. SC-22, No. 3, Jun. 1987, pp. 330-334.

*Primary Examiner*—James B. Mullins
*Attorney, Agent, or Firm*—Merchant, Gould, Smith, Edell, Welter & Schmidt

[57] ABSTRACT

A cost-effective, low power and low distortion digital data line driver is disclosed with the capability to operate from a limited voltage source while maintaining wide output voltage swings. The line driver has the noise immunity attribute of a fully differential input device without all the usual complex CMFB circuitry normally required. The line driver provides a low distortion output with a low output impedance and maintains its impedance value on the same order of magnitude at frequencies up to four times the Nyquist rate.

8 Claims, 5 Drawing Sheets

1ST GAIN STAGE

CMFB STAGE

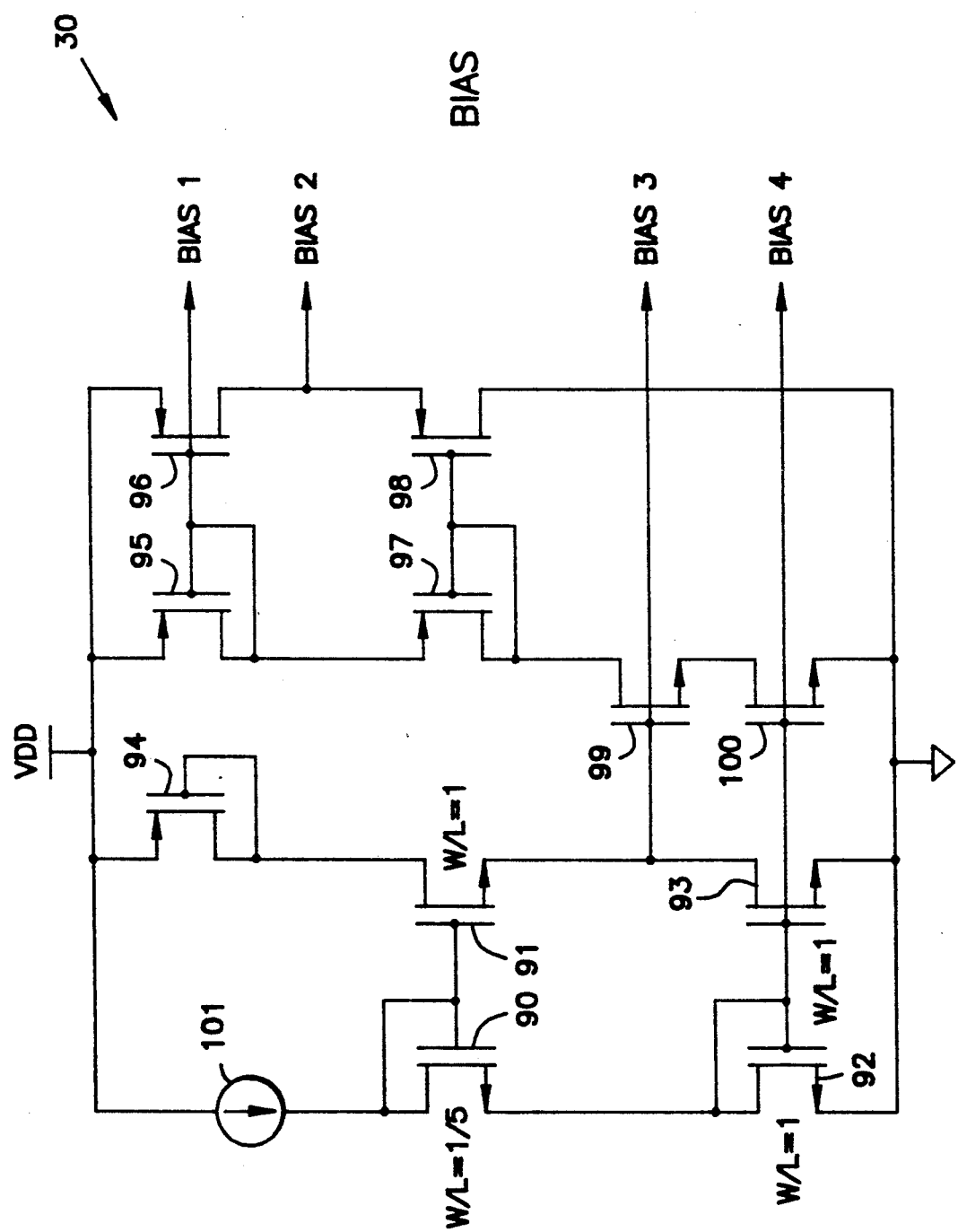

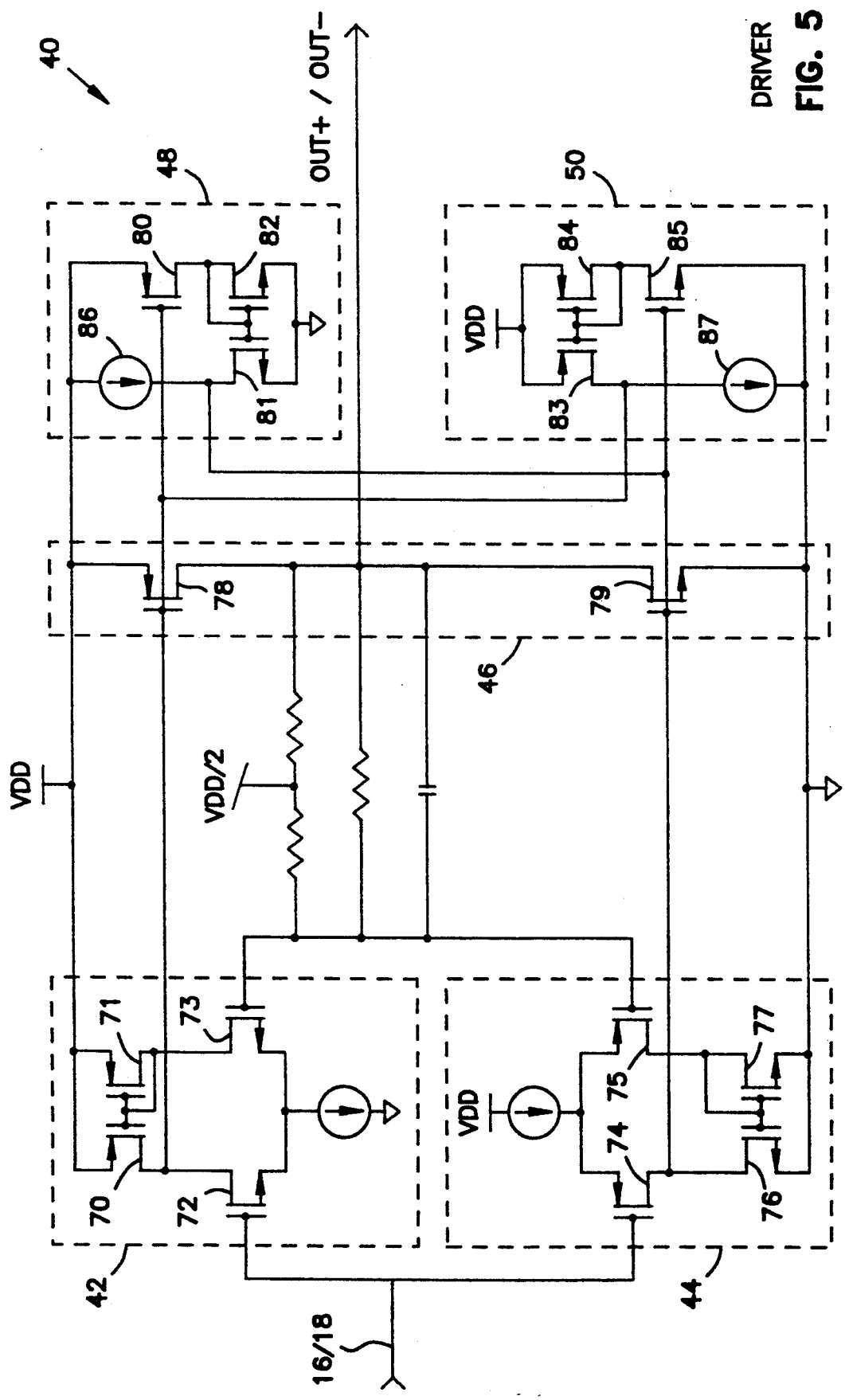
FIG. 5 DRIVER

DIGITAL DATA LINE DRIVER

FIELD OF THE INVENTION

This invention relates generally to line drivers in data communication systems and more particularly, to a differential line driver suitable for use in a digital communication network such as a Digital Data Service (DDS) Network or an Integrated Services Digital Network (ISDN).

BACKGROUND OF THE INVENTION

In communication systems, and particularly in digital communication systems, there is a need to provide a line driver for driving digital data onto the transmission line so as to faithfully reproduce the desired signal with little or no distortion. Exemplary, but not exclusive, is a line driver in an integrated service digital network (ISDN) as defined by the American National Standard Institute (ANSI) in specification (ANSI T1.601-1988), incorporated by reference herein. The line driver typically is required to drive data over a twisted pair cable at rates up to 160 kilobits per second with magnitudes as high as six volts peak-to-peak. In order to achieve low distortion and maximum power transfer, the output impedance of the line driver must be as low as possible so that the termination impedance at the transmitter and receiver ends approximately equal each other and the line driver output impedance must maintain its value on the same order of magnitude at frequencies up to four times the Nyquist data rate.

In the design of a digital data line driver, tradeoffs must be made in order to accommodate cost versus performance. Typically, a line driver will have a differential input to facilitate a high common mode rejection ratio (CMRR) so that noise common to both inputs will cancel. A low distortion, high current output is also desirable so that a remotely located receiver can reconstruct pulse amplitude modulated (PAM) data within the appropriate time slot. A conventional but costly approach for realizing a line driver with a high CMRR is to use a circuit with multiple stages, each stage having common mode feedback circuitry associated with it, compounding the complexity and expense of the driver. A conventional line driver often achieves a high current, low distortion output signal with the use of a class AB current mirror output. However, high threshold voltages, bias current variations, and high temperatures limit the voltage swing of a current mirror output if more than one transistor is used within the configuration. The limitation on the output voltage swing is detrimental in systems having access only to a fixed voltage supply, such as is commonly found in systems with a single TTL 4.75 volt power supply. If a single transistor is used for the output stage, a gain ($G_m$) of such transistor must be large enough to facilitate a limited swing on the input. The creation of such a transistor with a large $G_m$ results in it having a large gate capacitance, causing the overall output stage to have a lower non-dominant pole, thus decreasing the line driver's bandwidth. Additionally, a current mirror output cannot provide sufficient gain with relatively small resistive loads. Compounding the problems with the use of a current mirror output is that the line driver's bandwidth is further limited if crossover distortion is corrected by closed-loop feedback. If crossover distortion is corrected by increasing the bias currents in the line driver, higher standby power requirements result. Another technique commonly used to correct crossover distortion is dynamic common mode feedback. Inherent in this technique is the injection of undesirable clock noise, which in a sensitive data receiver such as one having an echo canceller circuit, impairs proper operation. Also, dynamic common mode feedback is difficult to analyze and is susceptible to perturbations in the input signal.

Still yet another technique used in line drivers is the sensing of an output common mode voltage. Because of the non-linear nature of a digital data driver output stage, sensing an output common mode voltage and feeding it back to the input stage results in unsatisfactory performance with large output swings.

Therefore, there is a need for an uncomplicated, cost-effective, low power, low distortion digital data line driver with the capability to provide wide output swings with a limited voltage source.

SUMMARY OF THE INVENTION

A digital data line driver is disclosed having a differential input and a low distortion, high current, differential output. The line driver comprises a first stage having a fully differential, class A, folded cascode amplifier and a second stage having a push-pull CMOS output with complimentary error amplifier feedback. The first stage provides a large common mode rejection ratio (CMRR) with only a sole common mode feedback circuit. The first stage also provides the majority of the driver's open loop gain and is buffered by an unity gain source follower to drive resistive loads in the common mode feedback (CMFB) circuit. The second stage has a limited gain of approximately one and one-half, for providing high current and a wide voltage swing while maintaining suitable performance without CMFB circuitry. The differential input voltage requirement for the first stage is reduced as a result of having some limited gain in the second stage. Reducing the differential input voltage requirement reduces the dynamic range requirement of the CMFB circuit as well as reduces the dynamic input range of the second stage without appreciably amplifying any common mode noise. The second stage has an internal DC gain of at least 60 db for reducing nonlinear distortion and for providing a lower output impedance.

For a better understanding of the invention, as well as other objects in further features thereof, reference is had to the following detailed description of the preferred embodiment taken in conjunction with accompanying drawings.

BRIEF DESCRIPTION OF THE DRAWINGS

Referring now to the drawings in which like reference numbers represent corresponding parts throughout:

FIG. 4 is a schematic diagram of the bias voltage generator stage depicted in FIG. 1; and FIG. 5 is a schematic diagram of one of the drivers in the output stage depicted in FIG. 1.

DESCRIPTION OF THE PREFERRED EMBODIMENT

Figure 1:
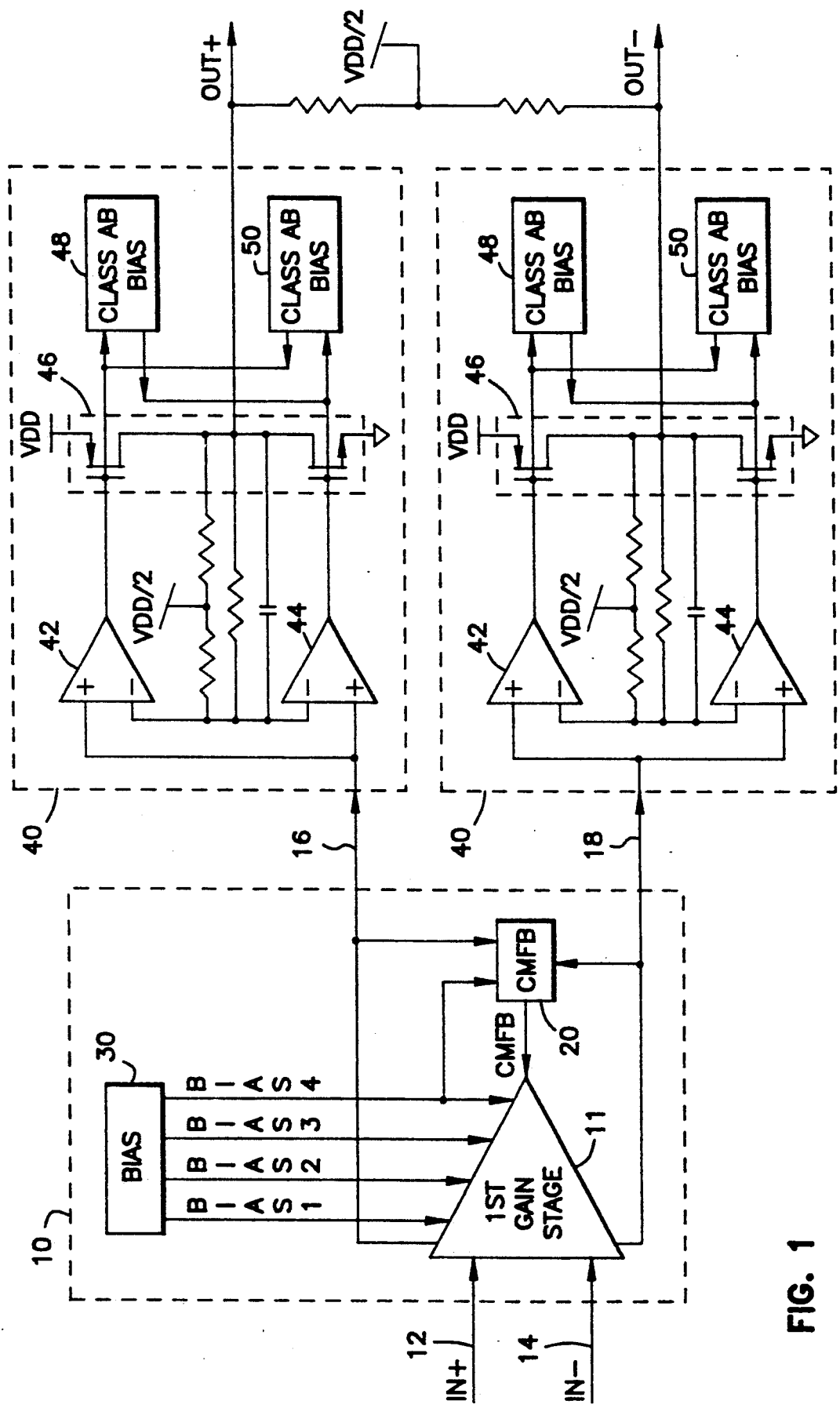
FIG. 1 is a simplified block diagram of a digital data line driver in accordance with the present invention.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Before describing in detail the particular improved digital data line driver according to the present invention, it should be noted that the invention resides primarily in a novel combination of conventional electronic circuits and not in the particular detailed configuration thereof. Accordingly, the structure, control and arrangement of these conventional circuits have been illustrated in the drawings by readily understandable block representations and schematic diagrams in order not to obscure the disclosure with structural details which will be readily apparent to those skilled in the art having the benefit of the description herein.

Referring now to FIG. 1, a simplified block diagram illustrates a two stage, fully differential (differential input and differential output) digital data line driver. The first stage 10 comprises a differential class A folded cascode amplifier 11 having a differential input to facilitate a high common mode rejection ratio CMRR and a large gain for providing the majority of the overall open loop gain, a CMFB circuit 20 and a bias voltage generator circuit 30. A differential input signal is applied between input lead IN+ 12 and input lead IN− 14. Differential output leads 16 and 18 of cascode amplifier 11 are coupled to the second stage which comprises two separate but identical driver circuits 40. Driver circuit 40 provides a low distortion, high current output and comprises a first common source differential error amplifier 42, a second common source differential error amplifier 44, a push-pull CMOS transistor pair 46 for providing wide voltage output swings close to the voltage supply rails, and a first and a second class AB bias circuit 48 and 50 respectively.

Figure 2:
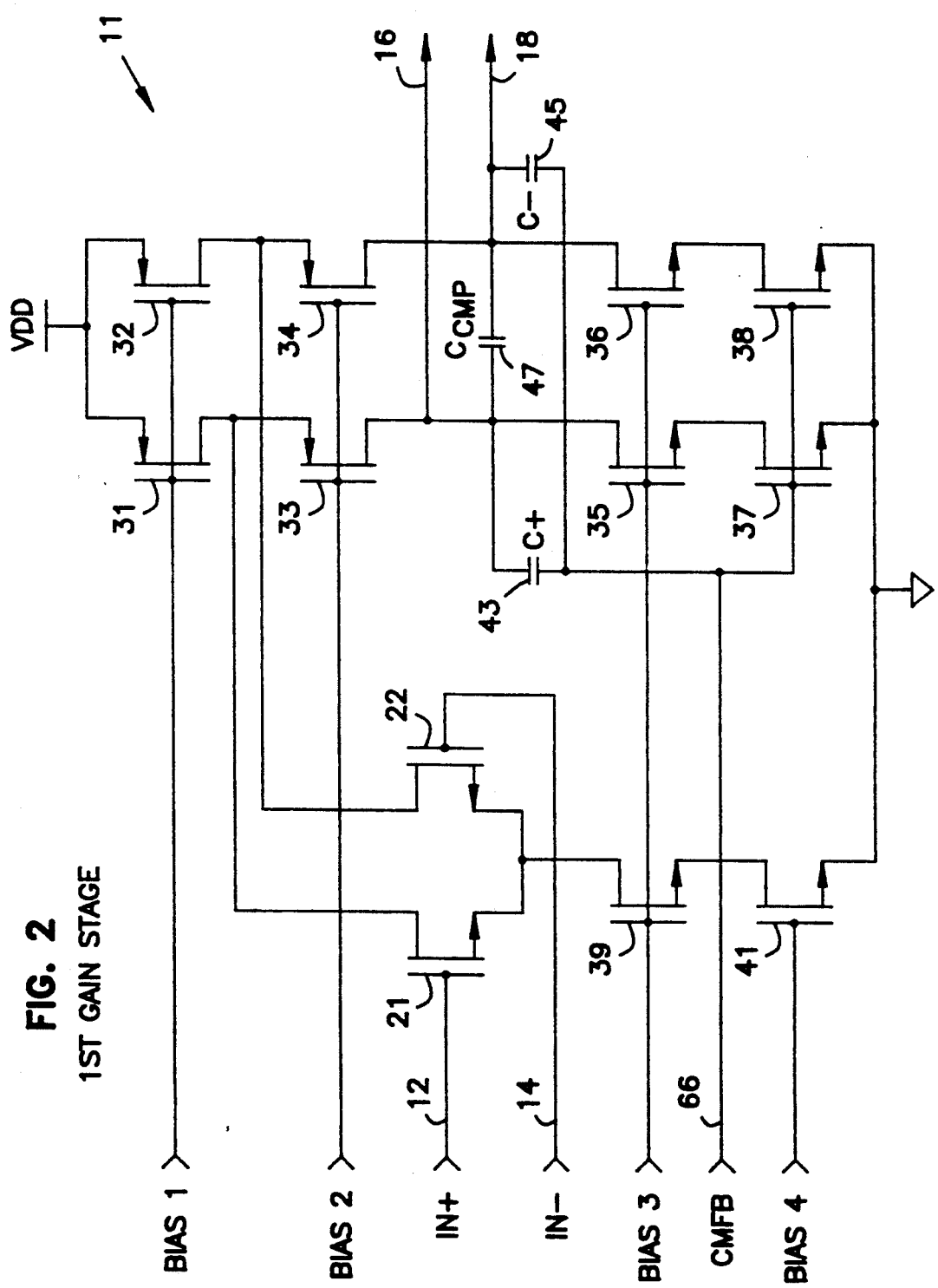
FIG. 2 is a schematic diagram of the first gain stage depicted in FIG. 1.

Referring now to FIG. 2, a schematic diagram illustrates in more detail the fully differential, class A folded cascode amplifier 11. Transistors 21 and 22 have their sources commonly connected and have their gates connected to differential inputs IN+ 12 and IN− 14 respectively. Transistors 31 through 38 are coupled in a cascode fashion with the drains of transistors 33 and 35 coupled together and acting as differential output 16 and the drains of transistors 34 and 36 coupled together and acting as differential output 18. Transistors 39 and 41 are coupled in series with input transistors 21 and 22 to control input bias currents. The drains of transistors 21 and 22 are respectively coupled to the node formed by the drain of transistor 31 and the source of transistor 33 and the node formed by the drain of transistor 32 and the source of transistor 34. Input lead CMFB 66 is coupled to the gates of transistors 37 and 38 and to a first side of capacitors $C_+$ 43 and $C_-$ 45. Capacitor $C_{cmp}$ 47 is coupled between the second side of capacitors $C_+$ 43 and $C_-$ 45. $C_{cmp}$ 47 along with the serial combination of $C_+$ 43 and $C_-$ 45 sets the dominant pole of first gain stage 11. Input CMFB 66 is compensated by a dominant pole provided by capacitors $C_+$ 43 and $C_-$ 45 which provide an effective capacitance ($C_{eff}$) according to the Miller effect wherein:

$$C_{eff} = (C_+ + C_-) \cdot G_{m37} + R_{out}$$

where:
$G_{m31}$ = Gain of transistor 31
$G_{m37}$ = Gain of transistor 37
$r_{o31}$ = Output resistance of transistor 31
$r_{o33}$ = Output resistance of transistor 33
$r_{o35}$ = Output resistance of transistor 35
$r_{o37}$ = Output resistance of transistor 37
// = in parallel with
$R_{out} = r_{o35} \cdot (r_{o37} \cdot G_{m37}) // r_{o33} \cdot (r_{o31} \cdot G_{m31})$ (Output impedance at the node representing the coupling of the drains of transistors 33 and 35)

Figure 3:
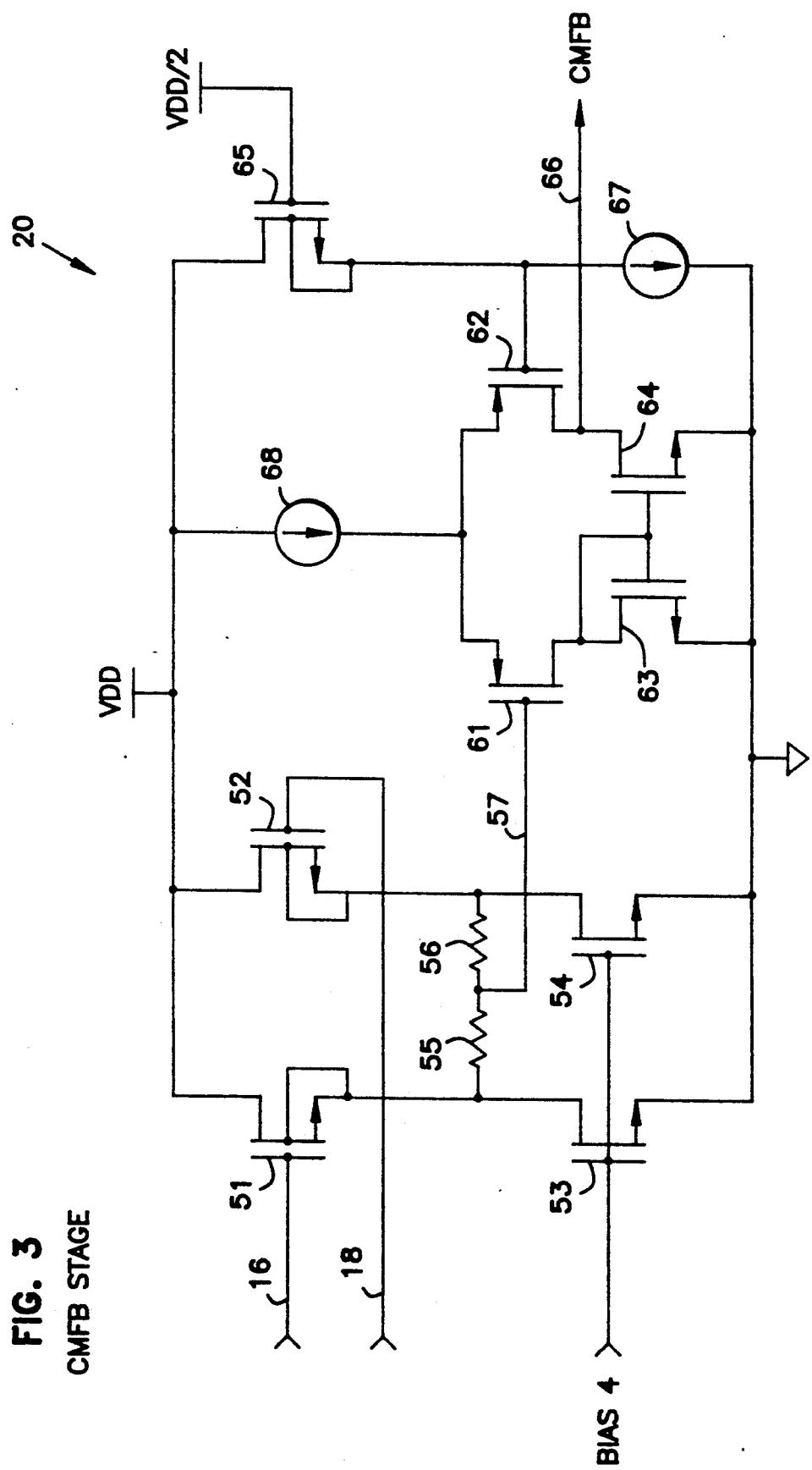
FIG. 3 is a schematic diagram of the common mode feedback stage depicted in FIG. 1.

Referring now to FIG. 3, a schematic diagram illustrates in more detail the common mode feedback (CMFB) circuit 20. Differential outputs 16 and 18 of cascode amplifier 11 are coupled to and buffered by transistors 51 through 54 which collectively act as a source follower to allow first gain stage 10 to drive resistive loads 55 and 56. Center tap 57 between resistive loads 55 and 56 provides a common mode voltage to a complimentary output structure comprising transistors 61 through 64 in cascade with current source 68. A common mode feedback voltage (CMFB) 66 is obtained from commonly connected drains of transistors 62 and 64. Transistor 65 together with current source 67 provides a bias for the gate of transistor 62.

Reference is now made to FIG. 4 in which bias voltage generator circuit 30 is schematically illustrated. Transistors 90 through 100 and current source 101 provide bias voltages BIAS1, BIAS2, BIAS3, and BIAS4 independent of the individual threshold voltages of said transistors and invariant with semiconductor fabrication processes. The bias voltages provide a typical current of 50 $\mu$A wherein transistors 91 through 93 have a relative width to length (W/L) ratio of 1 with respect to transistor 90 which has a W/L ratio of 1/5.

Referring now to FIG. 5, driver circuit 40 is schematically illustrated. Collectively, transistors 70 through 73 form the first common source differential error amplifier 42. Likewise, transistors 74 through 77 form the second common source differential amplifier 44. PMOS transistor 78 and NMOS transistor 79 comprise the push-pull CMOS transistor pair 46. First and second error amplifiers 42 and 44 are coupled to the CMOS push-pull pair 46 in a feedback fashion so that the overall gain of driver 40 is approximately one and one-half, eliminating the need for common mode feedback in driver 40 and increasing the overall bandwidth. Transistors 80 through 85 and current sources 86 and 87 collectively establish a bias such that push-pull CMOS pair 46 operates as a class AB amplifier.

The detailed description of the preferred embodiment of the invention having been set forth herein for the purpose of explaining the principles thereof, it is known that there may be modifications, variation or change in the invention without departing from the proper scope of the invention and the claims thereto.

What is claimed is:
1. A digital data line driver comprising:
   (a) a first stage having common mode feedback, the first stage including,
      (i) a class A folded cascode amplifier for providing a majority of the driver's open loop gain, the amplifier having a differential input for receiving a differential input signal, a single-ended common mode feedback input for receiving a com- mon mode feedback voltage and, a differential output, (ii) a common mode feedback circuit having a differential input and a single-ended output, the input coupled to the cascode amplifier output and the single-ended output coupled to the cascode amplifier common mode feedback input; and (b) a second stage having a gain close to unity coupled to the first stage, the second stage including, (i) a pair of identical driver circuit, each circuit comprising a pair of error amplifiers having their inverting inputs coupled together and their non-inverting inputs coupled together and each having a single-ended output, each pair of non-inverting inputs being respectively coupled to the differential output of the first stage, and (ii) a class AB push-pull complimentary transistor output circuit, coupled to and driven by the single-ended outputs of the driver circuits, the output circuit being coupled back to the inverting inputs so as to provide a second stage gain close to unity.

2. A digital data line driver in accordance with claim 1, wherein the first stage class A folded cascode amplifier further comprises a first and second capacitor for furnishing a dominant pole and for compensating the common mode feedback voltage, the first and second capacitors providing an effective capacitance equivalent to a product of a sum of the first and second capacitors and a parallel output impedance of the first stage output and a gain of an internal transistor.

3. A digital data line driver in accordance with claim 1, wherein the second stage has a closed loop gain of substantially one and one-half.

4. A digital data line driver in accordance with claim 1, wherein the class A folded cascode amplifier further includes a plurality of bias inputs and the common mode feedback circuit further includes at least one bias input, the first stage further comprising a bias voltage generator circuit having a plurality of outputs coupled to the plurality of bias inputs on the cascode amplifier and to the at least one of the bias voltage input on the common mode feedback circuit.

5. A digital data line driver in accordance with claim 1, wherein the class AB push-pull output circuit comprises a CMOS transistor pair having commonly connected drains forming one leg of a differential output, the non-inverting inputs of the error amplifiers being coupled to the commonly connected drains and each error amplifier output respectively being coupled to gates of the CMOS transistor pair.

6. A digital data line driver in accordance with claim 1, wherein the differential output of the class A folded cascode amplifier is further coupled to unity gain source followers comprising the common mode feedback circuit.

7. A digital data line driver in accordance with claim 4 wherein the bias voltage generator provides a plurality of bias voltages, each voltage invariant with varying MOS device threshold voltages.

8. A digital data line driver suitable for use in a Digital Data Service and an Integrated Services Digital Network, the driver comprising:

(a) a first stage having common mode feedback and providing a large open loop gain, the first stage including a class A folded cascode amplifier having a differential input for receiving signals, a common mode feedback input for receiving a common mode feedback voltage from a common mode feedback circuit, and a differential output, the common mode feedback circuit being coupled between the differential output and a common mode feedback input on the cascode amplifier; and (b) a second stage having an input coupled to the first stage differential output and having a gain close to unity, the second stage including a push-pull CMOS output with complimentary error amplifier feedback for providing a high current and a wide voltage swing output while maintaining suitable performance without common mode feedback circuitry.

* * * * *

UNITED STATES PATENT AND TRADEMARK OFFICE
CERTIFICATE OF CORRECTION

PATENT NO. : 5,166,635

DATED : November 24, 1992

INVENTOR(S) : Cheng C. Shih

It is certified that error appears in the above-identified patent and that said Letters Patent is hereby corrected as shown below:

Column 3, lines 28 & 29, "facili'te" should read --facilitate--. Column 4, line 1, "+$R_{out}$" should read --·$R_{out}$--. Column 5, line 11, "circuit" should read --circuits--.

Signed and Sealed this

Twenty-seventh Day of April, 1993

*Attest:*

MICHAEL K. KIRK

*Attesting Officer*     *Acting Commissioner of Patents and Trademarks*